United States Patent
Jenkins

[19]

[11] Patent Number: 6,104,239

[45] Date of Patent: Aug. 15, 2000

[54] METHOD FOR CORRECTING FREQUENCY-VARYING NONLINEAR ERRORS AND DIGITAL CORRECTION CIRCUIT IMPLEMENTING SAME

[75] Inventor: Brett Jenkins, W. Springfield, Mass.

[73] Assignee: Thomcast Communications, Inc., Southwick, Mass.

[21] Appl. No.: 09/267,113

[22] Filed: Mar. 12, 1999

[51] Int. Cl.[7] .................................................. G01R 19/00
[52] U.S. Cl. ............................... 330/2; 330/149; 375/296
[58] Field of Search ........................ 330/2, 149; 375/296, 375/297

[56] References Cited

U.S. PATENT DOCUMENTS

| | | | |
|---|---|---|---|
| 5,699,383 | 12/1997 | Ichiyoshi | 375/297 |
| 5,740,520 | 4/1998 | Cyze et al. | 455/69 |
| 5,892,397 | 4/1999 | Belcher et al. | 330/149 |
| 5,898,338 | 4/1999 | Proctor et al. | 330/149 |
| 5,900,778 | 4/1999 | Stonick et al. | 330/149 |
| 5,903,823 | 5/1999 | Moriyama et al. | 455/126 |
| 5,917,373 | 6/1999 | Twitchell | 330/149 |
| 5,959,499 | 5/1999 | Khan et al. | 330/149 |
| 5,990,734 | 11/1999 | Wright et al. | 330/2 |

*Primary Examiner*—Robert Pascal
*Assistant Examiner*—Henry Choe
*Attorney, Agent, or Firm*—Rothwell, Figg, Ernst & Manbeck

[57] ABSTRACT

A method and system for correcting errors introduced by a non-linear amplifying device to an input signal inputted to the device. A Look-Up Table (LUT) stores error correction values indexed against input signal amplitude values and input signal frequency values. The amplitude and frequency of an input signal to be inputted to the non-linear amplifying device are measured, and stored error correction values corresponding to the measured amplitude and frequency are retrieved from the LUT and used to modify the input signal accordingly.

14 Claims, 3 Drawing Sheets

| r | $r_e$ | $\theta_e$ |
|---|---|---|
| 0 | $r_{e0}$ | $\theta_{e0}$ |
| 1 | $r_{e1}$ | $\theta_{e1}$ |
| 2 | $r_{e2}$ | $\theta_{e2}$ |
| 3 | $r_{e3}$ | $\theta_{e3}$ |
| . | . | . |
| . | . | . |
| . | . | . |
| 255 | $r_{e255}$ | $\theta_{e255}$ |

METHOD FOR CORRECTING FREQUENCY-VARYING NONLINEAR ERRORS AND DIGITAL CORRECTION CIRCUIT IMPLEMENTING SAME

BACKGROUND OF THE INVENTION

1. Field of the Invention

The present invention relates generally to transmission of broadcast television signals using non-linear devices as high power amplifiers, and more particularly to methods and systems for precorrecting input signals before they are inputted to a non-linear amplifying device for transmission to an antenna for propagation.

2. Background and Related Art

It is generally known in the art to compensate for distortions introduced to input signals (such as composite television signals) by non-linear devices used to amplify such signals, by precorrecting such signals prior to inputting them to the non-linear device. See, e.g., U.S. Pat. No. 5,198,904.

The benefits of inductive output tubes (IOTs) as power amplifiers in television transmitters, especially in common amplification configurations, are well known in terms of increased efficiency and reliability. However, a characteristic of the IOT which must be compensated for is its nonlinearity.

A correction scheme known as Digital Adaptive Correction (DAP) has been proposed to compensate for signal distortions caused by such non-linear amplifying devices. According to DAP, the output signal of a non-linear amplifier is measured and compared with an ideal signal at the output of a modulator. The difference between the ideal signal and the measured output signal represents error caused by the non-linear amplifier. This difference could be stored, such as in a Look-Up Table (LUT), against magnitude and/or phase values of the input signal. Thereafter, signals being inputted to the modulator would be measured, the appropriate correction value would be retrieved from the LUT, and applied to the input signal before being amplified by the non-linear device.

A significant problem exists with the proposed DAP correction scheme in that it assumes that the non-linear characteristic of the amplifying device remains the same over the entire frequency band of the input signal to be amplified. The present inventor has observed, however, that in some IOT devices, the non-linearity actually varies over the frequency band of interest. The proposed DAP correction scheme is unable to compensate for such frequency-varying non-linearity, because it is a one-dimensional correction, taking into account only the amplitude of the input signal at any sampling point in determining the appropriate correction value to add to the input signal before it is amplified.

There thus exists a need in the art to provide a correction method and system that takes into account the frequency-varying nature of the characteristics of non-linear amplifying devices such as IOTs, as used particularly in television transmitters.

SUMMARY OF THE INVENTION

The present invention provides a solution to the shortcomings of the prior art as discussed above.

In particular, the present invention provides a method for correcting errors introduced by a non-linear amplifying device to an input signal inputted to said device, comprising the steps of providing a Look-Up Table (LUT) storing therein error correction values indexed against input signal amplitude values and input signal frequency values, measuring the amplitude and frequency of an input signal to be inputted to the non-linear amplifying device, retrieving from the LUT stored error correction values corresponding to the measured amplitude and frequency, modifying the input signal according to the retrieved error correction values, and inputting the modified input signal to the non-linear amplifying device.

According to another aspect of the invention, a system for correcting errors introduced to an input signal by a non-linear amplifying device is provided, which operates according to the method set forth above.

BRIEF DESCRIPTION OF THE DRAWINGS

The invention will be described in detail with reference to the following drawings in which.

DETAILED DESCRIPTION OF THE PREFERRED EMBODIMENTS

Figure 1:
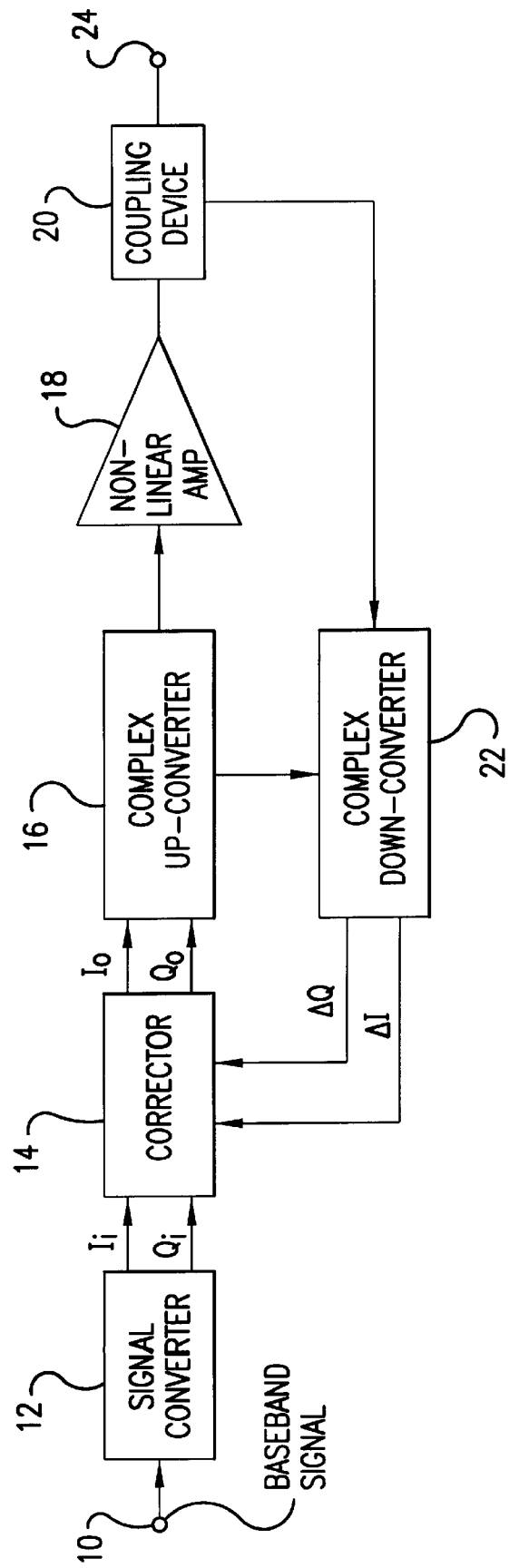
FIG. 1 is a block diagram of a correction circuit implementing the method of the present invention, according to one preferred embodiment.

FIG. 1 is a block diagram of a correction circuit for precorrecting an input composite television signal which is to be amplified by a non-linear amplifying device such as an inductive output tube (IOT).

A baseband composite television signal is inputted at input terminal 10 to a signal converter 12. Signal converter 12 converts the baseband signal to a complex signal representation including a real component (I) and an imaginary component (Q). The signal converter produces input signal components $I_i$ and $Q_i$ and inputs them to corrector circuit 14. Corrector circuit 14 converts the I and Q components to amplitude and phase coordinates r and θ, according to the formulae:

$$r = \sqrt{I^2 + Q^2} \qquad (1)$$

$$\theta = \tan^{-1}(Q/I) \qquad (2)$$

The corrector 14 then uses the r and θ values to look up predetermined stored correction values in a LUT, and applies the correction values to the signal before inputting the signal to complex up-converter 16. Complex up-converter 16 modulates the baseband complex signal components to a higher frequency, such as IF, and sends the high-frequency signal to the non-linear amplifying device 18 for amplification.

The correction values are determined and stored in the LUT as follows. The corrector 14 samples I and Q signals from the signal converter 12, and passes the samples to complex up-converter 16, where the complex signal is up-converted in frequency and transformed back to a composite time-varying signal. The complex down-converter 22 receives the amplified output signal of the non-linear amplifier 18 from a coupling device 20 which couples a portion of the output signal to the down-converter 22, while the remainder of the signal is outputted at output terminal 24. The complex down-converter 22 demodulates the output signal back to its baseband frequency, and transforms the demodulated signal to its complex representation in terms of I and Q signal components. The down-converter 22 also receives from up-converter 16 the same modulated signal that is sent to the non-linear amplifying device 18, and also demodulates the signal from the up-converter 16, and transforms that signal to its I and Q signal component representation.

Figures 3, 4:
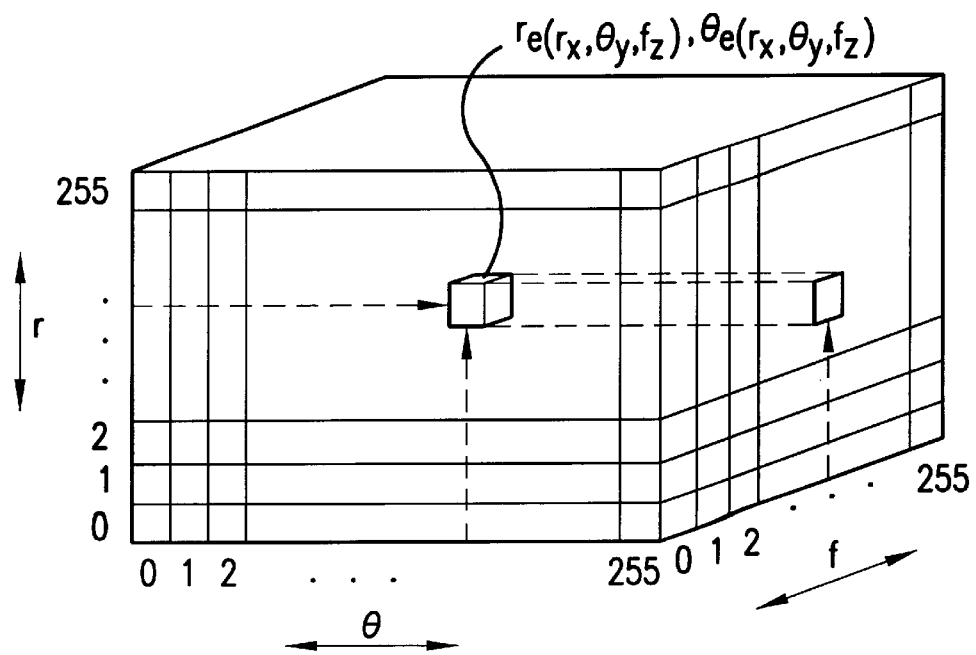
FIG. 3 is a diagram of a one-dimensional Look-Up Table (LUT) according to the conventional art.
FIG. 4 is a diagram of a three-dimensional LUT according to one embodiment of the present invention.

Down-converter 22 then compares the I and Q signals received from the output of the non-linear amplifying device 18 with the I and Q signals received from the complex up-converter 16. The difference signals ΔI and ΔQ represent the difference between the I and Q signals from the output of the non-linear amplifying device and the (ideal) I and Q signals from the output of the complex up-converter 16. The corrector 14 receives the ΔI and ΔQ signals (representing the error), converts them to r and θ coordinate values, and stores the values as error values $r_e$ and $θ_e$, and indexes these error values against the amplitude r of the input signal sample that was received from the signal converter. The conventional DAP thus creates a LUT as shown in FIG. 3. In FIG. 3, the amplitude r is divided into 256 values (0–255), and for each value of r the error or difference of the non-linear amplifier's output signal from the ideal signal at the output of the modulator (up-converter) is measured, and stored in the LUT.

Figure 2:
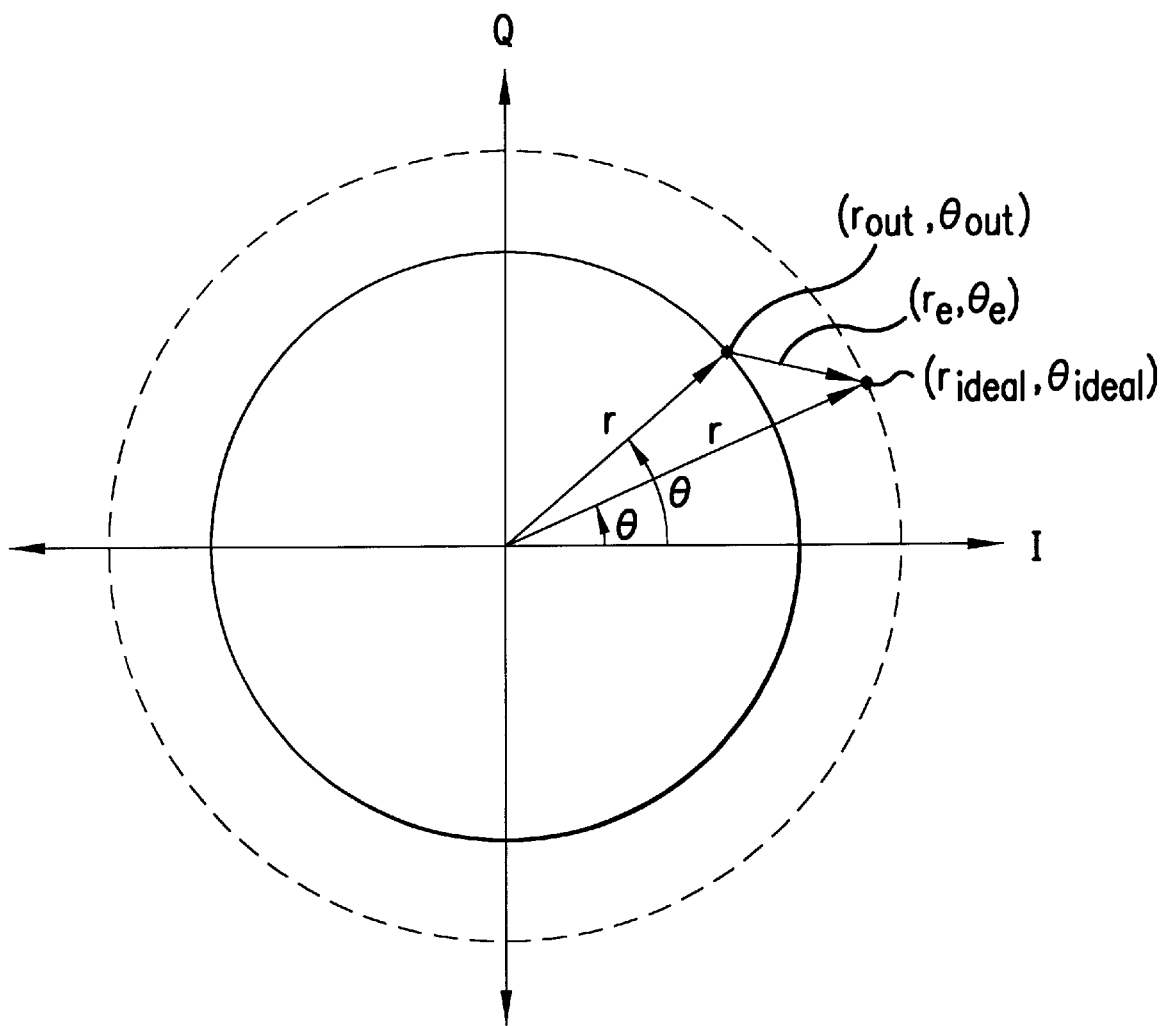
FIG. 2 is a graph illustrating complex coordinate representations of signal samples and the determination of errors between actual and ideal signal values, according to the invention.

As shown in FIG. 2, the difference between the vector $(r_{ideal}, θ_{ideal})$ representing the ideal output signal, and the actual output signal $(r_{out}, θ_{out})$, from the non-linear amplifier is an error vector $(r_e, θ_e)$ These values are stored in the LUT in inverse form, such that when they are added to the input signal, the input signal will be modified to have the opposite error as will be produced in the non-linear amplifier, such that when subjected to amplification by the non-linear amplifier, the correct amplitude and phase of the signal will be restored.

According to the present invention, the frequency of the input signal sample is determined, and the calculated error correction values of r and θ are stored according to measured values of r, θ, and frequency f, as shown in FIG. 4. As shown in FIG. 4, each of the amplitude, phase, and frequency parameters are divided into 256 values (representing 256 small subbands over the band of interest), and for each combination of values an error correction value $(r_{e(rx, θy, fz)}, θ_{e(rx, θy, fz)})$ is stored.

Alternatively, the error correction values could be stored as functions of r and f only. Additionally, the frequency band f may be divided into much larger divisions over the band of interest, such as three. For example, in the present broadcast scheme, each television channel is 6 MHz wide. Accordingly, this frequency band could be divided into three bands of 2 MHz each for the purpose of creating the LUT.

In order to measure the "frequency" of each sample, it is necessary to obtain an approximation by using one or more immediately adjacent samples, since a single sample does not actually contain any frequency information. For example, the frequency of the $n^{th}$ sample may be determined by subtracting $θ_{n-1}$ (the phase value of sample n−1) from $θ_n$, subtracting the time $t_{n-1}$ at which the n−1 sample is taken from the time tn at which the nth sample is taken, and dividing the resulting Δθ by the resulting θt to obtain an approximation of the frequency f of the $n^{th}$ sample. In mathematical terms, the frequency f can be determined by $$f = \frac{θ_n - θ_{n-1}}{t_n - t_{n-1}}$$

Since the sampling time of the circuit would be known, it would be necessary only to subtract the phase value of a sample from the phase value of the immediately preceding sample to determine an approximation of the frequency.

Once the LUT is created, the corrector would measure the amplitude r and frequency AO for each sample, look up the associated error vector, and add the error vector to the sample such that the distortion produced in the non-linear amplifier is compensated for.

The invention having been thus described, it will be apparent to those skilled in the art that the same may be varied in many ways without departing from the spirit and scope of the inventions. All such modifications are intended to be encompassed by the following claims.

What is claimed is:

1. A method for correcting errors introduced by a non-linear amplifying device to an input signal inputted to said device, comprising the steps of:

providing a Look-Up Table (LUT) storing therein error correction values indexed against input signal amplitude values and input signal frequency values;

measuring the amplitude and frequency of an input signal to be inputted to said non-linear amplifying device;

retrieving from said LUT stored error correction values corresponding to said measured amplitude and frequency;

modifying said input signal according to said retrieved error correction values; and inputting the modified input signal to the non-linear amplifying device.

2. The method of claim 1, wherein said error correction values comprise an amplitude correction value for modifying the amplitude of an input signal.

3. The method of claim 1, wherein said error correction values comprise a phase correction value for modifying the phase of an input signal.

4. The method of claim 1, wherein said error correction values comprise an amplitude correction value for modifying the amplitude of an input signal, and a phase correction value for modifying the phase of an input signal.

5. The method of claim 1, wherein the step of measuring the amplitude and frequency comprises the step of transforming an input signal into complex components, determining the amplitude and phase of said input signal from said complex components, and determining the frequency of said input signal from at least two phase measurements of said input signal.

6. The method of claim 1, wherein said non-linear amplifying device is an inductive output tube.

7. The method of claim 1, wherein said error correction values stored in said LUT also are indexed against input signal phase values.

8. A system for correcting errors introduced by a non-linear amplifying device to an input signal inputted to said device, comprising:

a Look-Up Table (LUT) storing therein error correction values indexed against input signal amplitude values and input signal frequency values; and a corrector for measuring the amplitude and frequency of an input signal to be inputted to said non-linear amplifying device;

said corrector retrieving from said LUT stored error correction values corresponding to said measured amplitude and frequency, modifying said input signal according to said retrieved error correction values, and inputting the modified input signal to the non-linear amplifying device.

9. The system of claim 8, wherein said error correction values comprise an amplitude correction value for modifying the amplitude of an input signal.

10. The system of claim 8, wherein said error correction values comprise a phase correction value for modifying the phase of an input signal.

11. The system of claim 8, wherein said error correction values comprise an amplitude correction value for modifying the amplitude of an input signal, and a phase correction value for modifying the phase of an input signal.

12. The system of claim 8, further including a signal converter for transforming an input signal into complex components, wherein said corrector determines the amplitude and phase of said input signal from said complex components, and determines the frequency of said input signal from at least two phase measurements of said input signal.

13. The system of claim 8, wherein said non-linear amplifying device is an inductive output tube.

14. The system of claim 8, wherein said error correction values stored in said LUT also are indexed against input signal phase values.

* * * * *